United States Patent
Chan et al.

(10) Patent No.: US 6,448,584 B1
(45) Date of Patent: Sep. 10, 2002

(54) LIGHT EMITTING DIODE WITH HIGH LUMINANCE AND METHOD FOR MAKING THE SAME

(76) Inventors: Shih-Hsiung Chan, 1001-1 University Road, Hsinchu (TW); Jian-Shihn Tsang, 1001-1 University Road, Hsinchu (TW); Jan-Dar Guo, 1001-1 University Road, Hsinchu (TW); Simon M. Sze, 1001-1 University Road, Hsinchu (TW)

( * ) Notice: Subject to any disclaimer, the term of this patent is extended or adjusted under 35 U.S.C. 154(b) by 0 days.

(21) Appl. No.: 09/482,602

(22) Filed: Jan. 14, 2000

(51) Int. Cl.$^7$ .................... H01L 29/12; H01L 33/00; H01L 31/072; H01L 29/20
(52) U.S. Cl. .................... 257/98; 257/98; 257/103; 257/201; 257/613; 257/615; 257/43
(58) Field of Search .................... 257/98, 201, 103, 257/613, 615, 43, 203

(56) References Cited

U.S. PATENT DOCUMENTS

| | | | | |
|---|---|---|---|---|
| 5,359,209 A | * | 10/1994 | Huang | 257/94 |
| RE35,665 E | * | 11/1997 | Lin et al. | 257/94 |
| 5,869,849 A | * | 2/1999 | Jou et al. | 257/96 |
| 6,057,562 A | * | 5/2000 | Lee et al. | 257/96 |
| 6,067,309 A | * | 5/2000 | Onomura et al. | 372/46 |
| 6,130,147 A | * | 10/2000 | Major et al. | 438/604 |
| 6,169,298 B1 | * | 1/2001 | Lin et al. | 257/103 |
| 6,225,648 B1 | * | 5/2001 | Hsieh et al. | 257/95 |
| 2001/0000916 A1 | * | 5/2001 | Kadota | 257/43 |

FOREIGN PATENT DOCUMENTS

JP    408167735 A    *  6/1996

OTHER PUBLICATIONS

Baillargeon, J.N. et al., "Luminescence Quenching and The Formation of The GaP$_{1-x}$N$_x$ Alloy in GaP with Increasing Nitrogen Contact", American Institute of Physics: Appl. Phys. Lett. vol. 60, (20), pp. 2540–2542 (1992).

(List continued on next page.)

*Primary Examiner*—Eddie Lee
*Assistant Examiner*—Joseph Nguyen
(74) *Attorney, Agent, or Firm*—Finnegan, Henderson, Farabow, Garrett & Dunner, L.L.P.

(57) ABSTRACT

The present invention relates to a light emitting diode with high luminance and method for making the same, and more particularly to a light emitting diode having a transparent window layer which is formed by a semiconductor film of nitrogen-containing compounds. The present invention is mainly directed to growing a window layer of a light emitting diode with a nitrogen-containing compound on the double heterostructure of InGaAlP. Since the energy gap of the nitrogen-containing compound is greater than that of the light emitted from the active layer and is smaller than that of GaP, it is easily to be doped and to form metallic ohmic electrode. Therefore, it is suitable to form a window layer, thereby increasing the light emitting efficiency of a light emitting diode. In addition, the nitrogen-containing compounds can be formed by the current MBE or OMVPE techniques. Therefore, the light emitting diode can be mass-produced and does have industrial applicability.

10 Claims, 4 Drawing Sheets

OTHER PUBLICATIONS

Miyoshi, S. et al., "Metalorganic Vapor Phase Epitaxy of GaP1–xNx Alloys on GaP", American Institute of Physics: Appl. Phys. Lett. vol. 63, (25), pp. 3506–3508 (1993).

Bi, W.G. et al., "N Incorporation in GaP and Band gap Bowing of GaNx P1–x", American Institute of Physics: Appl. Phys. Lett. vol.69, (24), pp. 3710–3712 (1996).

Biwa, G. et al., "Metalorganic Vapor Phase Epitaxy of GaP1–x–yAsyNx Quanternary Alloys on GaP", Department of Physics, The University of Tokyo, pp. 116–117.

Iwato, K. et al., "Gas Source Molecular Beam Epitaxial Growth of GaN1–xPx (x s ≦ 0.015) Using Ion–Removed Electron Cyclotron Resonance Radical Cell", Jpn. J. appli. Phys. vol. 35, pp. L 1634–L 1637 (1996).

Yaguchi, H. et al., "Photoluminescence Excitation Spectroscopy of GaP1–xNx Alloys: Conduction–Band–Edge Formation by Nitrogen Incorporation", Journal of Crystal Growth 170, pp. 353–356 (1997).

Yaguchi, H., "Theoretical Study of Conduction Bad Edge Formation in GaP1–xNx Alloys Using a Tight–Binding Approximation", Department of Applied Physics, The University of Tokyo, pp. 122–123.

Uesugi, K.. et al., "Metalorganic Molecular Beam Epitaxy of GaNAs Alloys on (001) GaAs", Research Institute for Electronic Science, Hokkaido University, pp. 118–119.

* cited by examiner

LIGHT EMITTING DIODE WITH HIGH LUMINANCE AND METHOD FOR MAKING THE SAME

BACKGROUND OF THE INVENTION

1. Field of the Invention

The present invention relates to a light emitting diode with high luminance and method for making the same, and more particularly to a light emitting diode having a transparent window layer which is formed by a semiconductor film of nitrogen-containing compounds.

2. Description of the Related Art

Researches on nitrides of Group III or V attract people's attention recently, particularly when the blue light emitting diode with high luminance was mass produced by a Japanese company in 1993, many companies become engaged in the development of blue and green light emitting diodes with high luminance and laser diodes.

In a semiconductor made of nitrogen-containing compounds of Group III or V, for an InGaAlP which energy gap less than that of nitride, when the ratio of aluminum to gallium in the active region of the light emitting element is changed, the light wavelength varies from 680 nm to 550 nm. Further, since the lattice constant of InGaAlP can match the GaAs substrate perfectly, InGaAlP is suitable for the light emitting element used for visible light region.

As shown in FIG. 1, the structure of a conventional InGaAlP light emitting diode is formed by growing a multi-layered epitaxial layer on a n-type GaAs light-absorbing substrate 10. First, a n-InGaAlP confining layer 11 is grown on the GaAs substrate 10, then a InGaAlP active layer 12 is grown on the n-InGaAlP confining layer 11 and then a p-InGaAlP confining layer 13 is grown on the active layer 12 such that a double heterostructure is formed. Finally, the light emitting surface of the diode is coated with a front surface metal electrode 14 and the surface of the GaAs substrate 10 on which the epitaxial layer is not formed is coated with a back surface metal electrode 15. The light wavelength of the light emitting diode is determined by the ratio of aluminum to gallium in the active layer 12. An increase in the amount of aluminum in the active layer may shorten the light wavelength of the light emitting diode. Meanwhile, the amount of aluminum in the confining layers 11, 13 outside the active layer 12 must be greater than that of aluminum in the active layer 12 such that the carriers may be not only effectively injected into the active layer 12 but also prevent the light emitted from the active layer 12 from being absorbed by the confining layers 11 and 13.

Generally speaking, with the exception of the combination efficiency of the electron and the electric hole, the major factor for determining the light emitting efficiency of a light emitting diode is whether the current on the front surface electrode 14 can be effectively distributed to the boundary of grains such that the light can be uniformly produced from the p-n junction. If the p-type confining layer 13 is too resistant to effectively distribute the current, the current will flow from the front surface electrode 14 to the back surface electrode 15, causing current jamming such that the current can not be spread effectively and that most of the generated light can not emit due to the blocking of the opaque front surface electrode 14 or the light emitting efficiency thereof is reduced because the generated light is reflected by the metal electrode 14 and absorbed by the substrate. The conventional InGaAlP light emitting diode has the above drawbacks. This is because the concentration of the p-type InGaAlP confining layer 13 is generally below $1 \times 10^{18}$ cm$^{-3}$ and the hole mobility thereof is merely 10~20 cm$^2 \cdot$V/sec, which forms the resistivity 0.5 Ω-cm. The resistivity is so high that the lateral current can not be spread over the whole grain. To solve this problem, different structures, as shown in FIGS. 2 and 3, have been developed. The structure as illustrated in FIG. 2 is formed by growing a semiconductor window layer 16 differing from the InGaAlP layer on the p-type InGaAlP confining layer 13. The window layer is characterized by its low resistivity, perfect conductivity, and energy gap which is greater than that of the active layer 12. Thus, the semiconductor window layer 16 will not absorb the light emitted from the p-n junction. Generally speaking, the materials suitable for the semiconductor window layer 16 include GaAlAs, GaAsP, and GaP, etc. The optimum thickness for the window layer 16 ranges from five to tens of micrometers. However, the lattice constants of GaAsP and GaP do not match with those of the GaAs substrate and the InGaAlP layer 13, thus a large amount of dislocation on the growing interface is occurred and opto-electronic characteristics of the light emitting diode are adversely effected.

Another structure of the conventional technique is illustrated in FIG. 3 and is characterized in that a current blocking layer 17 and a Bragg reflector layer 18 are additionally formed and the current spreading layer or window layer 19 is made of GaAlAs. The current flowed from the front surface electrode 14 is thus influenced by the current blocking layer 17 so as to effectively distribute to the current spreading layer 19. In addition, the added Bragg reflector layer 18 between the GaAs substrate 10 and InGaAlP confining layer 11 can reduce the amount of light emitted from the InGaAlP active layer 12 to be absorbed by the GaAs substrate 10. Such a structure can double the light emitting efficiency of the light emitting diode. However, such a structure has drawbacks of complicated process and long processing time. The current blocking layer 17 is defined after two times of organic metal chemical vapor phase deposition and one time of masking and etching process. In addition, the aluminum ratio in the InGaAlP confining layer 13 is very high and thus oxidization is easily occurred and the growth is hard to control. Furthermore, the growth for the composition and the thickness of the Bragg reflector layer 18 should be precisely controlled and the thickness is about a few micrometers. Therefore, the manufacturing process will incur a much longer time.

As mentioned above, nitride has been applied to the manufacture of blue and green light emitting diodes. The emitting wavelength can be adjusted from a beam of violet light to a beam of green-blue light and even a beam of orange light by adjusting the metal components of Group III in the active layer. The conventional nitride researches are confined to the adjustment of the metal components of Group III and the manufacture of the blue and green light emitting diodes. Recently, nitride researches regarding the adjustment of the metal components of Group V, such as GaPN, GaAsN, GaPAsN, have been engaged.

Although the energy gaps of GaN and GaP are 3.4 eV and 2.3 eV respectively, the energy gap of is not increased with the increase amount of nitrogen but is increased with a bow-like curve. Therefore, when $GaP_{1-x}N_x$ contains a few amount of nitrogen, it possesses an energy gap less than that of GaP. As far as $GaP_{1-x-y}As_xN_y$ is concerned, the lattice constant of compound is reduced when the amount of nitrogen is increased and is increased when the amount of arsenic is increased. Such a characteristic can be used to adjust the lattice constant of $GaP_{1-x-y}As_xN_y$ to be equal to, greater or smaller than that of GaP. Therefore, $GaP_{1-x-y}As_xN_y$ can be used to replace the GaP window layer of a light emitting diode with high luminance so as to reduce dislocation and to increase light emitting efficiency.

SUMMARY OF THE INVENTION

To avoid the above-mentioned problems encountered in the prior art, the object of the present invention is to provide a novel high luminance InGaAlP light emitting diode having nitrogen-containing compounds and method for making the same. The present invention is mainly directed to growing a window layer of a light emitting diode with a nitrogen-containing compound on the double heterostructure of InGaAlP. Since the energy gap of the nitrogen-containing compound is greater than that of the light emitted from the active layer and is smaller than that of GaP, it is easily to be doped and to form metallic ohmic electrode. Therefore, it is suitable to form a window layer, thereby increasing the light emitting efficiency of a light emitting diode.

BRIEF DESCRIPTION OF THE DRAWINGS

The present invention will become more fully understood from the detailed description given hereinbelow and the accompanying drawings, which are given by way of illustration only, and thus are not limitative of the present invention, wherein.

DETAILED DESCRIPTION OF THE INVENTION

Figure 1:
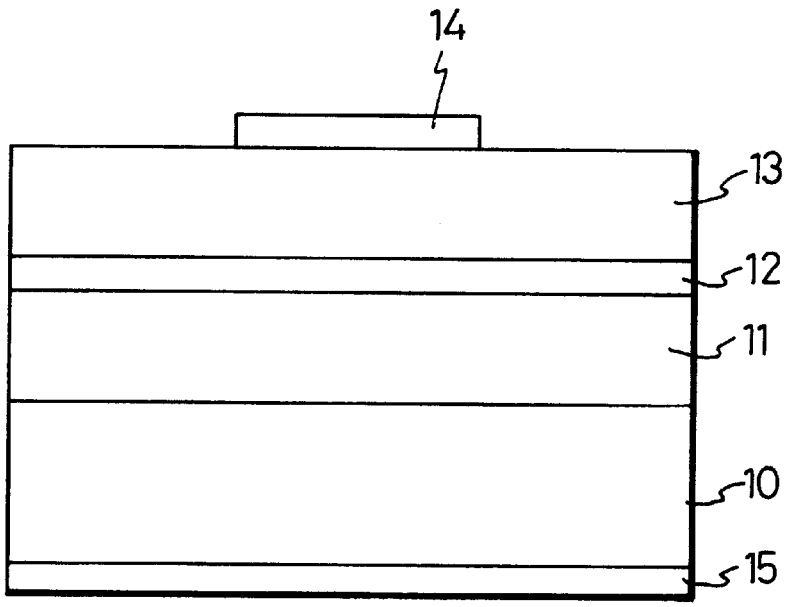
FIG. 1 is a sectional view of the structure of a conventional InGaAlP light emitting diode.
Figure 2:
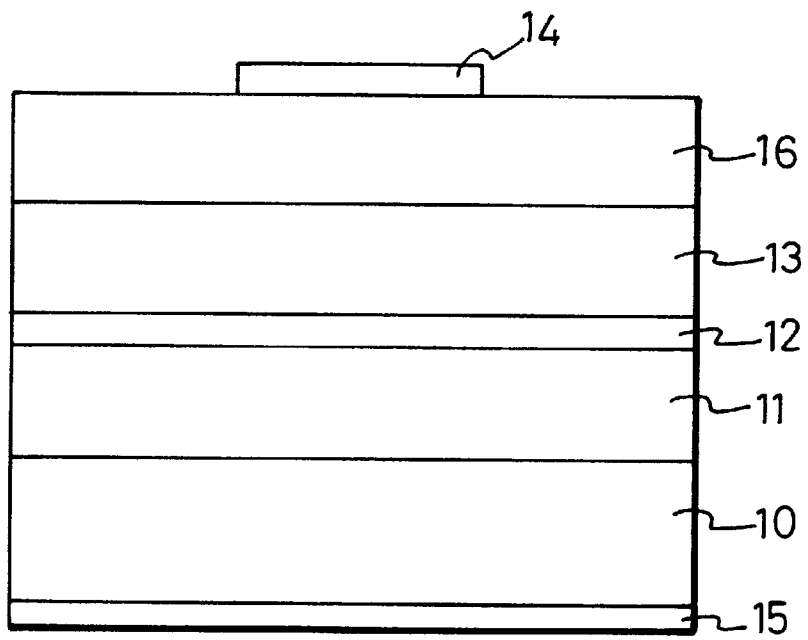
FIG. 2 is a sectional view of the structure of a conventional InGaAlP light emitting diode having a window layer.
Figure 3:
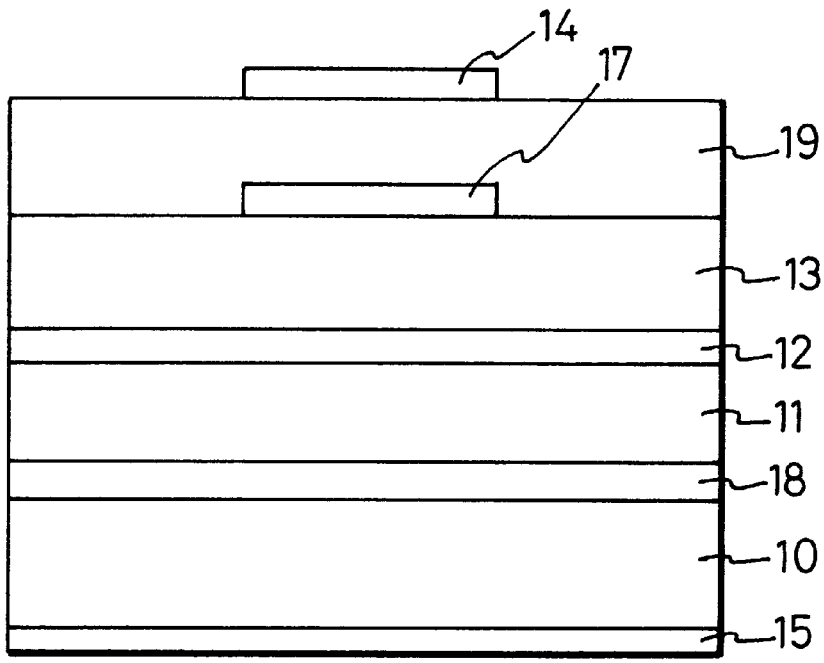
FIG. 3 is a sectional view of the structure of a conventional InGaAlP light emitting diode having a window layer, current blocking layer and Bragg reflector layer.
Figure 4:
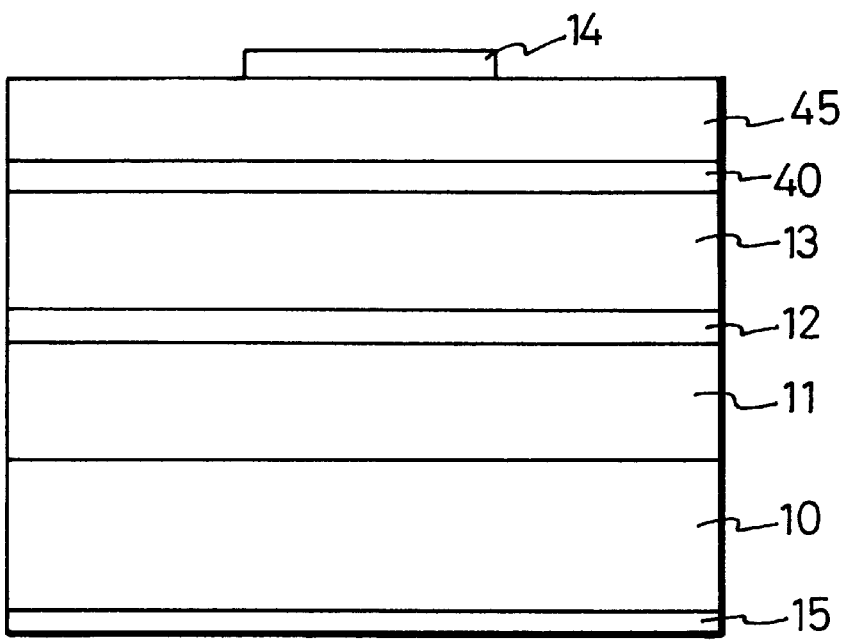
FIG. 4 is a sectional view of the InGaAlP light emitting diode having a semiconductor window layer of nitrogen-containing compounds according to a preferred embodiment of the present application.
Figure 5:
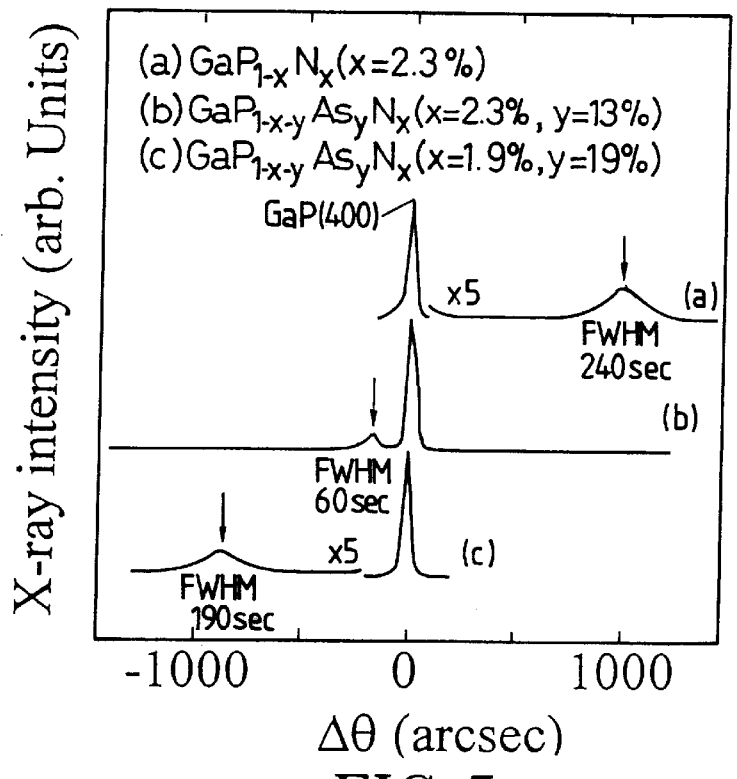
FIG. 5 illustrates the double-crystal X-ray diffraction spectrum for $GaP_{1-x}N_x$ and $GaP_{1-x-y}As_yN_x$ at different species and proportions.
Figure 6:
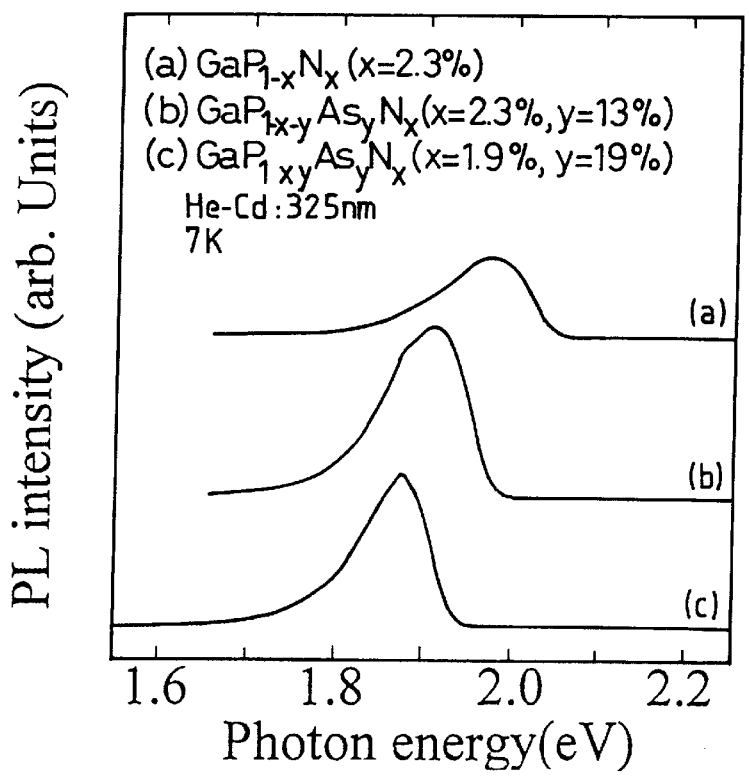
FIG. 6 illustrates the photo luminance (PL) spectrum for $GaP_{1-x}N_x$ and $GaP_{1-x-y}As_yN_x$ at different species and proportions.
Figure 7:
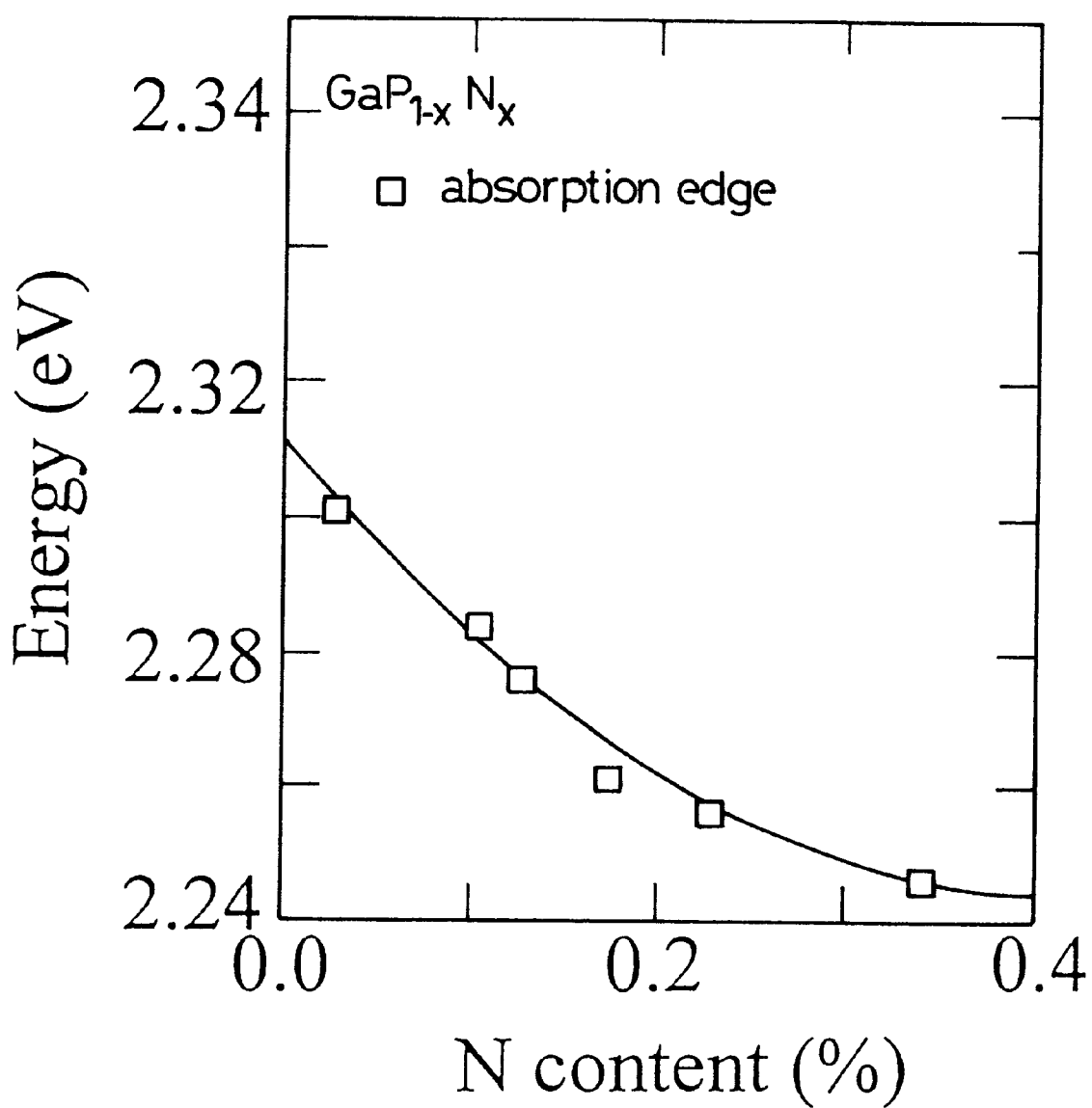
FIG. 7 illustrates the absorption edge energy of $GaP_{1-x}N_x$ at different nitrogen proportions.

Please refer to FIG. 4, it illustrates the structure of an InGaAlP light emitting diode with high luminance according to a preferred embodiment of the present application. The diode is formed as follows. On a n-type GaAs substrate 10, sequentially grows a n-type InGaAlP confining layer 11, an InGaAlP active layer 12, and a p-type InGaAlP confining layer 13, a p-type ohmic contact layer 40 and a transparent window layer 45 having nitrogen-containing compounds film, wherein the nitrogen-containing compounds film can be formed by molecular beam epitaxy (MBE) or organic metal vapor phase epitaxy (OMVPE) and the thickness thereof is about 0.1 to tens of micrometers. Finally, a circular-type metallic layer is formed on the light emitting surface of the light emitting diode so as to form a front surface electrode 14 and a metallic layer is formed on the lower surface of the n-type GaAs substrate 10 (i.e. the surface on which the epitaxial layer does not grow) so as to form a back surface electrode 15, wherein the materials of the p-type ohmic contact layer 40 may be selected from a group of GaAs, GaAsP, GaP, GaPN, GaPAsN, InPAsN and InGaPAsN. The materials of the transparent window layer 45 may be selected from a group of GaPN, GaPAsN, InPAsN and InGaPAsN and the thickness thereof is preferably in the range of 0.1 to tens micrometers. The lattice constant of the nitrogen-containing compounds is varied depending on the spices and proportions of the compounds such that the lattice constant can be equal to, greater or smaller than that of GaP. FIG. 5 illustrates the double-crystal X-ray diffraction spectrum for $GaP_{1-x}N_x$ and $GaP_{1-x-y}As_yN_x$ at different species and proportions, wherein (a) illustrates that the lattice constant of GaPN is smaller than that of GaP when P=97.7% and N=2.3%; (b) illustrates that the lattice constant of GaPAsN is approximately equal to that of GaP when P=84.7%, As=13% and N=2.3%; and (c) illustrates that the lattice constant of GaPAsN is greater than that of GaP when P=79.1%, As=19% and N=1.9%. FIG. 6 illustrates the photo luminance spectrum for $GaP_{1-x}N_x$ and $GaP_{1-x-y}As_yN_x$ at different species and proportions. As shown in FIG. 6, the energy position corresponding to the peak value of spectrum intensity will be dropped when the proportion of arsenic is increased. Therefore, arsenic not only can be used to adjust lattice constant but also can be used to adjust the absorption wavelength of GaPAsN. FIGS. 5 and 6 illustrate the condition of N=2.3%. FIG. 7 illustrates the absorption edge energy gap of $GaP_{1-x}N_x$ at different nitrogen proportions (0–0.4%). Under this circumstance, all the absorption edge energy gap are greater than 2.24 eV. Therefore, as far as an InGaAlP light emitting diode with a light emitting wavelength of 550–680 nm is concerned, it possesses a good transparent characteristic which does not absorb the light emitting from the active layer.

In addition, according to the $(Al_xGa_{1-x})_{0.5}In_{0.5}P$ light emitting diode, the emitting wavelength can be adjusted from a beam of red light to a beam of green light by adjusting the proportion of aluminum in the double heterostructure. The components of the window layer can also be adjusted dependent on the different wavelengths of the $(Al_xGa_{1-x})_{0.5}In_{0.5}P$ light emitting diode, thereby achieving the changeability of the device.

The present invention first discloses a light emitting diode having a transparent window layer which is formed by a nitrogen-containing compounds. The present invention is mainly directed to growing a window layer of a light emitting diode with a nitrogen-containing compound on the double heterostructure of InGaAlP. Since the energy gap of the nitrogen-containing compound is greater than that of the light emitted from the active layer and is smaller than that of GaP, it is easily to be doped and to form metallic ohmic electrode. Therefore, it is suitable to form a window layer, thereby increasing the light emitting efficiency of a light emitting diode. In addition, the nitrogen-containing compounds can be formed by the current MBE or OMVPE techniques. Therefore, the light emitting diode can be mass-produced and does have industrial applicability.

Although the invention has been disclosed in terms of a preferred embodiment, the disclosure is not intended to limit the invention. The invention still can be modified, varied by persons skilled in the art without departing from the scope and spirit of the appended claims of the invention.

What is claimed is:

1. A light emitting diode, comprising:
   a first metallic electrode;
   a substrate doped with a first conductivity type dopant and formed on the first metallic electrode;
   a first confining layer formed on the substrate and doped with the first conductivity type dopant;

an active layer formed on the first confining layer;

a second confining layer formed on the active layer and doped with a second conductive type dopant;

an ohmic contact layer formed on the second confining layer and doped with the second conductivity type dopant;

a transparent window layer having nitrogen-containing compounds formed on the ohmic contact layer;

a second metal electrode formed on the transparent window layer;

wherein the material of the transparent window layer is selected from a group of GaPN, GaPAsN, InPAsN and InGaPAsN.

2. A light emitting diode, comprising:

a first metallic electrode;

a substrate doped with a first conductivity type dopant and formed on the first metallic electrode;

a first confining layer formed on the substrate and doped with the first conductivity type dopant;

an active layer formed on the first confining layer;

a second confining layer formed on the active layer and doped with a second conductive type dopant;

an ohmic contact layer formed on the second confining layer and doped with the second conductivity type dopant;

a transparent window layer having nitrogen-containing compounds formed on the ohmic contact layer;

a second metal electrode formed on the transparent window layer;

wherein the first confining layer, active layer and second confining layer are all made of InGaAlP.

3. A light emitting diode, comprising:

a first metallic electrode;

a substrate doped with a first conductivity type dopant and formed on the first metallic electrode;

a first confining layer formed on the substrate and doped with the first conductivity type dopant;

an active layer formed on the first confining layer;

a second confining layer formed on the active layer and doped with a second conductive type dopant;

an ohmic contact layer formed on the second confining layer and doped with the second conductivity type dopant;

a transparent window layer having nitrogen-containing compounds formed on the ohmic contact layer;

a second metal electrode formed on the transparent window layer;

wherein the substrate is made of GaAs.

4. The light emitting diode as claimed in claim 1, wherein the first conductivity type is p type, and the second conductivity type is n type.

5. The light emitting diode as claimed in claim 1, wherein the first conductivity type is n type, and the second conductivity type is p type.

6. The light emitting diode claimed in claim 1, wherein a first conductivity type of the ohmic contact is n type, and a second conductivity type of the ohmic contact is p type.

7. A light emitting diode, comprising:

a first metallic electrode;

a substrate doped with a first conductivity type dopant and formed on the first metallic electrode;

a first confining layer formed on the substrate and doped with the first conductivity type dopant;

an active layer formed on the first confining layer;

a second confining layer formed on the active layer and doped with a second conductive type dopant;

an ohmic contact layer formed on the second confining layer and doped with the second conductivity type dopant;

a transparent window layer having nitrogen-containing compounds formed on the ohmic contact layer;

a second metal electrode formed on the transparent window layer;

wherein the material of the ohmic contact layer is selected from a group of GaAs, GaAsP, GaP, GaPN, GaPAsN, GaPAsN, InPAsN and InGaPAsN.

8. The light emitting diode as claimed in claim 1, wherein the thickness of the transparent window layer is in a range from 1 micrometer to 100 micrometers.

9. The light emitting diode as claimed in claim 1, wherein the transparent window layer is a semiconductor film of nitrogen-containing compounds formed by molecular beam epitaxy.

10. The light emitting diode as claimed in claim 1, wherein the transparent window layer is a semiconductor film of nitrogen-containing compounds formed by organic metal vapor phase epitaxy.

* * * * *